United States Patent [19]
Dougherty et al.

[11] Patent Number: 6,144,185
[45] Date of Patent: Nov. 7, 2000

[54] METHOD AND APPARATUS FOR DETERMINING THE CONDITION OF A BATTERY THROUGH THE USE OF MULTIPLE BATTERY TESTS

[75] Inventors: Thomas J. Dougherty, Waukesha; Michael E. Iverson, Brown Deer, both of Wis.

[73] Assignee: Johnson Controls Technology Company, Plymouth, Mich.

[21] Appl. No.: 09/274,467

[22] Filed: Mar. 22, 1999

[51] Int. Cl.[7] .......................... H01M 10/44; H01M 10/46
[52] U.S. Cl. ............................................................. 320/132
[58] Field of Search ................................... 320/127, 128, 320/132, 133, 149, DIG. 21; 324/426, 429, 430, 433

[56] References Cited

U.S. PATENT DOCUMENTS

| | | | |
|---|---|---|---|
| 4,193,025 | 3/1980 | Frailing et al. | 324/427 |
| 5,256,957 | 10/1993 | Wiesspeiner. | |
| 5,572,136 | 11/1996 | Champlin | 324/426 |
| 5,757,192 | 5/1998 | McShane et al. | 324/427 |
| 5,821,756 | 10/1998 | McShane et al. | 324/430 |
| 5,831,435 | 11/1998 | Troy | 324/426 |

FOREIGN PATENT DOCUMENTS

| | | |
|---|---|---|
| 0 447 928 A1 | 9/1991 | European Pat. Off. . |
| WO 92/15022 | 9/1992 | WIPO . |

OTHER PUBLICATIONS

Search Report (PCT/US00/07520). Aug. 4, 2000.

*Primary Examiner*—Edward H. Tso
*Attorney, Agent, or Firm*—Quarles & Brady LLP

[57] ABSTRACT

A method and apparatus for determining the state of charge of a battery include use of multiple battery tests to provide complementary insight into battery condition before, during, and after battery charging. Battery testing is performed using a light resistive load, a heavy resistive load, a conductance tester, and a battery charger. During a preliminary charging stage, average battery current and a predicted battery temperature are used to determine whether or not the battery is capable of being substantially fully charged, thereby permitting avoidance of unneeded charging. In the later charging stage, the rate of change of battery cold cranking amps is monitored to detect an end of charge condition.

22 Claims, 2 Drawing Sheets

METHOD AND APPARATUS FOR DETERMINING THE CONDITION OF A BATTERY THROUGH THE USE OF MULTIPLE BATTERY TESTS

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

1. Field of the Invention

This invention relates generally to electric storage battery chargers, testers, and methods of operation therefor and, more particularly, to a combined charger and tester for an electric storage battery and a method of operation therefor implementing multiple tests to determine battery condition prior to, during, and after battery charging.

2. Discussion of the Related Art

As is well understood in the art, a vehicle includes an electric storage battery that provides the power necessary to start the vehicle and to operate the various vehicle systems. The vehicle also includes an alternator that charges the battery when the vehicle is running so that the battery maintains a sufficient charge for these purposes. A typical vehicle battery will be a 12 volt lead-acid battery including six independent cells electrically connected together. Other sized batteries may also be used for this purpose, such as 6 volt batteries having three independent cells. Each cell in a battery of this type includes a positive and negative terminal, and the cells are electrically connected together in a series configuration.

Due to various reasons, such as a power drain on the battery when the vehicle is not running, the capacity of a vehicle battery may become diminished, and the battery will not be able to provide the power necessary to start the vehicle and/or operate the various vehicle systems. It is therefore necessary to use a separate charging device to recharge the battery and return it to its full or near full capacity for subsequent use in the vehicle. It has heretofore been known to be desirable to test the battery prior to recharging it to ensure that one or more cells in the battery are not defective, making recharging of the battery useless and unwise. Charging a battery having one or more bad cells may provide certain health and safety risks in that the bad cell may emit harmful smoke and/or gases during the charging sequence.

To facilitate such testing, there are a variety of known battery testers including light load testers, heavy load testers, and conductance testers, each having their own advantages and disadvantages. The light and heavy load testers typically connect a resistive load to the battery for a period of time in order to draw a relatively light or heavy battery current, respectively. Unlike load testers, conductance testers are passive in that they do not draw any appreciable current from a battery under test. Thus, conductance testers are more effective than traditional load testers in analyzing batteries at a low state of charge. However, there are times when it is desirable to draw battery current during testing, so load testers still have use. Traditionally, batteries have been analyzed with a single type of test prior to charging the battery.

Much like a physician who prefers to evaluate a patient using not simply one, but a number of tests offering different perspectives on the patient's condition, what is needed in the context of battery testing and charging is a technique for evaluating multiple tests providing distinct insights into battery condition before, during, and after battery charging. It is therefore an object of the present invention to provide such a technique.

BRIEF SUMMARY OF THE INVENTION

The present invention provides methods and apparatus for determining the state of charge of a battery. In both the method and the apparatus embodiments, multiple battery tests are used to provide different insights into battery condition before, during, and after battery charging.

Battery conditions, such as state of charge, are determined using a light resistive load, a heavy resistive load, a conductance tester, and a battery charger. Monitoring battery conditions with each of these elements permits taking advantage of what collective insight is provided by the combination of elements, rather than trying to analyze the battery using just one element. Moreover, collective use of these elements permits testing the battery during all states of charge.

The light resistive load is used in a light load test of the battery in which, among other things, battery bounce back voltages are determined. One of the bounce back voltage readings obtained after removal of the light load is used to determine battery state of charge. This computed state of charge is used as an entering quantity in a unique formula for determining the time to charge the battery.

During the initial stage of battery charging, average battery current is monitored to quickly determine whether or not the battery is capable of being substantially fully charged. If average battery current fails to exceed predetermined values over specified time periods, the charge is terminated, and a report is generated indicating that the battery is incapable of being substantially fully charged. Additionally, if the battery predicted temperature fails to exceed a predetermined value within a set time, the charge is terminated, and a report is generated indicating that the battery is too cold to charge. In both cases, the time and expense of attempting to fully charge the battery is avoided.

Following the initial phase of battery charging, the heavy resistive load is used in a heavy load test in which battery voltage readings are taken with the load connected and disconnected to the battery. A determination is then made as to whether or not the battery responded to the initial charge as would be expected for a normal battery. Thereafter, if the battery has behaved normally, battery charging continues, and the conductance tester monitors battery cold cranking amps. The rate of change of battery cold cranking amps is determined on a rolling basis in search of a condition indicative of the battery charge being complete. At this point, the charge is terminated regardless of the time remaining on the charging timer; however, if an end of charge condition is not detected, then the charge ends on timer expiration.

One or more bar codes may be placed on the battery to indicate one or more battery characteristics, such as battery acid-to-paste ratio. In this manner, a light pen may be used to scan such battery characteristics into the system for use in battery testing and charging, thereby making any needed battery data entry easier.

These and other objects, advantages and aspects of the invention will become apparent from the following description. In the description, reference is made to the accompanying drawings which form a part hereof, and in which there is shown a preferred embodiment of the invention. Such embodiment does not necessarily represent the full scope of the invention and reference is made therefor, to the claims herein for interpreting the scope of the invention.

DETAILED DESCRIPTION OF THE INVENTION

Figure 1:
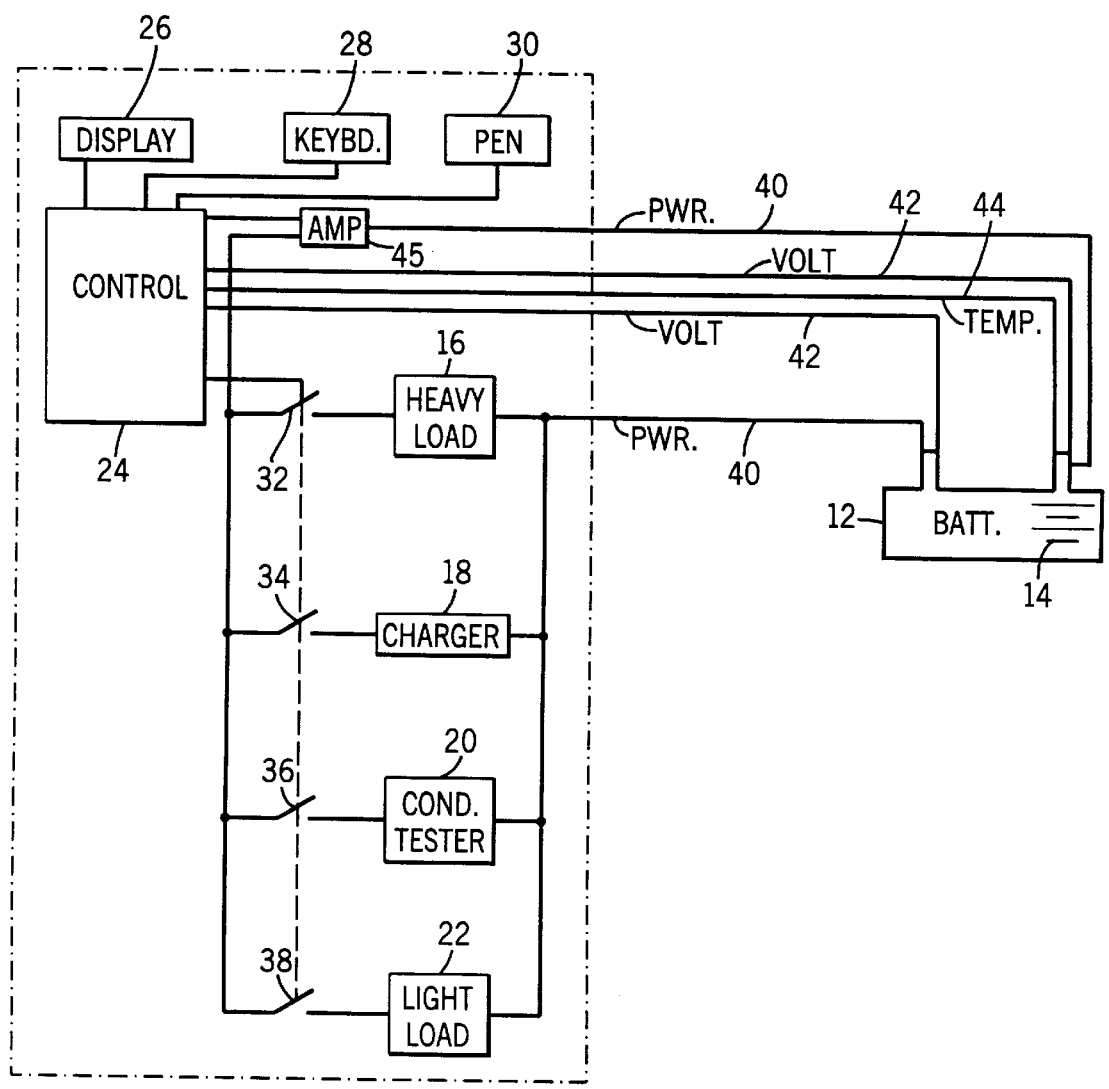
FIG. 1 is a simplified block diagram of the battery charger tester of the present invention connected to a battery.

Referring now to the drawings, wherein like reference characters represent corresponding elements throughout the several views, and more specifically referring to FIG. 1, the battery charger tester (or apparatus) 10 is coupled to a battery 12. Typically, battery 12 is a 12 volt DC power supply found in most automotive vehicles, though the present invention can be used with other types of batteries.

Apparatus 10 includes a light load 22, a heavy load 16, a battery charger 18, and a conductance tester 20. The light 22 and heavy 16 loads typically comprise resistive loads, such as resistors, selected to draw 3 amps and 150 amps from battery 12, respectively. Battery charger 18 preferably comprises a commercially available battery charger capable of providing a charging current in the 60–80 amp range. Conductance tester 20 preferably comprises a battery analyzer capable of reading battery conductance, such as model no. MCR-500 made by Midtronics, Inc. of Burr Ridge, Ill. Battery analyzers using Midtronic's conductance technology allow the user to passively test battery condition by injecting low frequency voltage through a battery's internal structure and observing outgoing in-phase current flow, which provides information used to determine battery condition. U.S. Pat. Nos. 5,821,756 and 5,757,192 (both incorporated herein by reference) provide greater detail related to such conductance type testers. The light load 22, heavy load 16, battery charger 18, and conductance tester 20 are coupled to battery 12 through power line 40 clamped to the battery terminals. Switches 32–38 are regulated by a controller 24 (as represented by dashed lines from controller 24) to place the light load 22, heavy load 16, battery charger 18, and conductance tester 20 on line with battery 12, respectively.

Controller 24 may comprise any one of a plurality of commercially available devices. Preferably, controller 24 includes an internal microprocessor for executing system instructions; memory containing instructions for carrying out the methodology of the present invention; memory for storing battery data obtained during battery testing and charging; an Analog-to-Digital (A-to-D) converter transforming analog battery voltage, current, and temperature readings into digital form; and a multiplexer controlling the flow of readings through the A-to-D converter.

Battery voltage readings are conveyed over lines 42 to controller 24. A temperature sensor (not shown) is clamped to a battery terminal and produces a signal representative of battery clamp temperature over line 44 to controller 24. Any commercially available temperature sensor may be used, and the battery clamp temperature readings are used to predict internal battery temperature, as is well known in the art. Battery current readings supplied to controller 24 are obtained from current flow through ammeter 45, or in any other well known manner.

A keypad 28 permits data entry into controller 24, and a display 26 shows messages related to battery testing and charging. A light pen 30 is coupled to controller 24 as another source for inputting data to controller 24. Specifically, battery 12 includes a bar code 14 representative of a battery characteristic, such as the battery acid-to-paste ratio, determined and posted during manufacture. Light pen 30 is used to scan the bar code data into controller 24 for use in battery testing and charging. Bar code 14 could also be used to represent the date of manufacture for battery 12, or any other battery characteristic.

OPERATION

Figure 2:
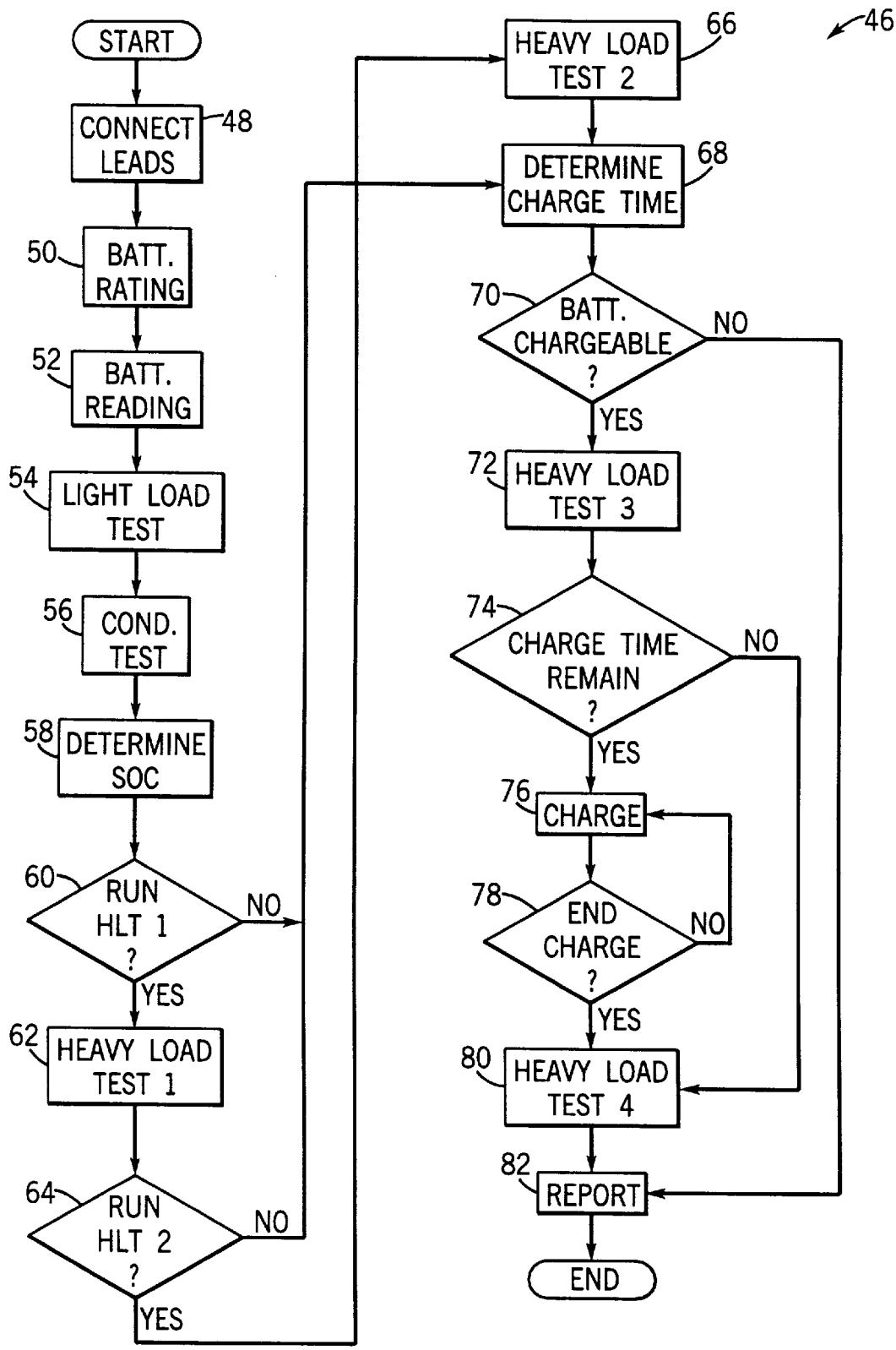
FIG. 2 is a simplified flow chart diagram depicting the method of the present invention.

Referring to FIG. 2, the method of testing and charging battery 12 is represented by system flow chart 46. Initially, at process block 48, the leads are connected to the battery terminals as represented in FIG. 1. At process block 50, the user inputs the battery rating (cold cranking amps) as determined by the battery manufacturer using keypad 28. Alternatively, if the battery rating has been provided in bar code form, light pen 30 scans this data into controller 24. At process block 52, controller 24 takes a series of readings, including open circuit battery voltage and battery clamp temperature, and stores the readings in memory.

LIGHT LOAD AND CONDUCTIVITY TESTS

The first battery test to be run is the light load test, as represented by process block 54. Specifically, controller 24 closes switch 38 to place light load 22 on line with battery 12. Controller 24 receives a series of battery voltage readings at 0.5, 2, 5, 10, and 15 seconds after applying the load. Switch 38 is then opened, and controller 24 obtains battery bounce back voltage readings taken at 0.5, 2, 5, 10, and 15 seconds after removing the load. At process block 56, controller 24 closes switch 36 to initiate a conductance test, in which battery cold cranking amps (CCA) are measured by conductance tester 20. The CCA reading is stored in memory as the initial CCA measured for battery 12.

DETERMINING BATTERY STATE OF CHARGE

In determining battery state of charge at process block 58, the bounce back battery voltage reading taken 15 seconds after removal of light load 22 is used by controller 24 as an entering argument in the following table to yield the determined or computed state of charge for battery 12. For example, if the bounce back battery voltage reading taken 15 seconds after removal of light load 22 was 12.40 volts, then the battery state of charge would be 60% per the table below.

| Battery State of Charge (%): | Bounce Back Battery Voltage (DC volts): |
| --- | --- |
| 0 | 0–12.02 |
| 20 | 12.03–12.11 |
| 30 | 12.12–12.20 |
| 40 | 12.21–12.29 |
| 50 | 12.30–12.38 |
| 60 | 12.39–12.47 |
| 70 | 12.48–12.56 |
| 80 | 12.57–12.65 |
| 90 | 12.66–12.69 |
| 100 | 12.75 and above |

FIRST HEAVY LOAD TEST

At process block 60, a determination is made as to whether or not the first and second heavy losd tests will be run. Specifically, if the initial open circuit battery voltage is less than 8.00 DC volts, and the battery voltage reading taken 15 seconds after applying the light load is less than 2.00 DC volts, then the first and second heavy load tests (process blocks 62 and 66) are bypassed. In this case, controller 24 initiates a determination of battery charging time, as discussed below with respect to process block 68.

Assuming the condition is not met to skip the first and second heavy load tests, the first heavy load test is initiated by controller 24 closing switch 32, thereby placing heavy load 16 on line with battery 12. Battery voltage readings are taken at 0.5, 2, 5, 10, and 15 seconds after applying the load. Thereafter, switch 32 is opened, and battery voltage readings are taken at 0.5, 2, 5, 10, and 15 seconds after removing the load.

SECOND HEAVY LOAD TEST

Following the first heavy load test, controller 24 determines at process block 64 whether the second heavy load test will be run. In particular, if the presently predicted battery temperature is above 30° F., and the computed battery state of charge is above 40%, then the second heavy load test is run. Failure to meet this condition causes controller 24 to initiate the battery charging time determination per process block 68. Assuming the second heavy load test is to be run, controller 24 again closes switch 32 and takes battery voltage readings at 0.5, 2, 5, 10, and 15 seconds after applying heavy load 16. After receiving these voltage readings, controller 24 opens switch 32, and battery voltage readings are taken at 0.5, 2, 5, 10, and 15 seconds after removing the load.

As part of the second heavy load test, a predicted temperature for battery 12 is first obtained. This is done in a well known manner that uses measured battery clamp temperature to make an estimate of internal battery temperature. Then, using the following equation, a corrected battery voltage is determined:

$$CBV = 11.10 - (1000-BR)/500 - 12*(80-PT)/1000 - (1000-BR)/4000 + (7*(12.75-BB)/10)*(1+(1000-BR)/500)$$

where:

CBV=Corrected Battery Voltage (DC volts);

BR=Battery Rating (Manufacturer's stated battery rating in CCA);

PT=Predicted Temperature of Battery (°F.); and

BB=Bounce Back Voltage obtained 15 seconds after removal of the load (DC volts).

The determined value for corrected battery voltage (CBV) is then compared to the reading of actual battery voltage taken at 15 seconds after application of heavy load 16. If the actual battery voltage taken at 15 seconds after application of heavy load 16 exceeds the determined corrected battery voltage (CBV), this indicates a good battery.

Similar comparison is made under the third and fourth heavy load tests (discussed below). In using the corrected battery voltage formula (from above) in the third and fourth heavy load tests, the battery rating value (BR) remains the same for heavy load tests 2–4; however, the predicted temperature (PT) is determined for each test, so it may differ between heavy load tests 2–4. Similarly, the bounce back (BB) voltage used in the formula for corrected battery voltage (CBV) is separately determined for each heavy load test 2–4.

TIME TO CHARGE DETERMINATION

Following the first and second heavy load tests (whether or not performed), the duration of the battery charge is determined at process block 68 according to the following equation:

$$TTC = ((KTEMP*SP*(100-SOC)/(30*CR))+5)$$

where:

TTC=Time to Charge (minutes);

KTEMP=constant determined using battery predicted temperature obtained at time of TTC computation (see table below);

SP=Set Point constant (initial value of battery rating input by user in CCA);

SOC=Computed State of Charge of battery (as determined from state of charge table above); and CR=maximum continuous Charge Rate of charger (Amps).

| Predicted Battery Temperature (° F.): | KTEMP: |
| --- | --- |
| 0–15 | 1.8 |
| 16–30 | 1.5 |
| 31–45 | 1.2 |
| 46–60 | 1.1 |
| above 60 | 1.0 |

BATTERY CHARGING AND CHARGING TESTS

Once the duration of the battery charge is determined, the charge commences at process block 70 and runs for the computed time. The charge is initiated by controller 24 closing switch 34 and activating battery charger 18. During the charge, battery charging time is counted down from the computed charge duration, and the charge automatically terminates at time zero. However, as discussed below, the battery charge is periodically interrupted for battery testing. Moreover, battery testing also occurs during the charge.

5 MINUTE CHARGE TEST

Within the first 5 minutes of battery charging, tests are conducted at process block 70 that determine whether or not the battery is capable of being substantially fully charged. Specifically, average battery current, average battery voltage, and CCA readings are obtained at 10 seconds, and at 1, 2, 3, 4, and 5 minutes after commencing the charge. The CCA readings are obtained using the conductance tester 20. After the first two minutes of readings, controller 24 determines whether average battery current at 1 minute is less than 2 amps, and whether average battery current at 2 minutes is less than 4 amps. If both conditions are met, this indicates that the battery is not capable of being substantially fully charged. Accordingly, controller 24 terminates the charge and provides an appropriate message to the user on display 26, per process block 82.

Assuming these two conditions were not met, another test is run at the 2 minute point of the charge. Specifically, controller 24 determines whether the predicted battery temperature (determined earlier for computing battery state of charge) is less than 20° F., and whether average battery current at 2 minutes is less than 3 amps. Satisfaction of both conditions means that it is too cold to charge the battery. Thus, controller 24 would terminate the charge and provide an suitable message to the user, per process block 82.

THIRD HEAVY LOAD TEST

Provided that the 5 minute charge was not prematurely terminated due to a faulty battery or excessively cold battery temperature, controller 24 opens switch 34 and interrupts battery charger 18 at the end of this initial charging period to run a third heavy load test, at process block 72. Controller 24 closes switch 32, and battery voltage readings are taken at 0.5, 2, 5, 10, and 15 seconds after applying heavy load 16.

Thereafter, controller 24 opens switch 32, and battery voltage readings are taken at 0.5, 2, 5, 10, and 15 seconds after removing the load.

FINAL CHARGE

As represented by process block 74, if some amount of charging time remains on the countdown, controller 24 closes switch 34 and activates battery charger 18 per process block 76; however, if the remaining charging time was zero, the fourth heavy load test would be initiated at process block 80.

During the final charging sequence, as represented by process blocks 76 and 78, controller 24 receives average battery current, average battery voltage, and CCA readings at 1 minute intervals. At process block 78, a rolling test is conducted using the CCA readings to determine when the battery is substantially fully charged. Specifically, the rate of change of the CCA readings is determined over each five minute period (i.e., on a rolling basis). For a battery 12 with an originally computed state of charge under 90%, if the CCA rate of change is below 3 over a given 5 minute period, then the battery charge is considered complete. Alternatively, for a battery 12 having an originally computed state of charge above 90%, if the CCA rate of change is below 5 over a given 5 minute period, then the battery charge is considered complete. Thus, per process block 78, controller 24 continuously refreshes its five minute window of CCA rate of change data to determine when battery 12 is substantially fully charged.

FOURTH HEAVY LOAD TEST

If battery 12 reaches a substantially fully charged condition prior to having the charge countdown elapse, controller 24 terminates the charge, per process block 78, and commences the last heavy load test of process block 80. However, even if a fully charged condition is not detected, the charge will terminate once the charging countdown is complete. In either case, controller 24 opens switch 34 and deactivates battery charger 18. Then, the final heavy load test is conducted per process block 80, in which controller 24 closes switch 32 and takes battery voltage readings at 0.5, 2, 5, 10, and 15 seconds after applying heavy load 16. Once complete, switch 32 is opened, and battery voltage readings are taken at 0.5, 2, 5, 10, and 15 seconds after removing the load. An appropriate report is made to the user per process block 82.

It should be understood that the methods and apparatuses described above are only exemplary and do not limit the scope of the invention, and that various modifications could be made by those skilled in the art that would fall under the scope of the invention.

To apprise the public of the scope of this invention, the following claims are provided:

What is claimed:

1. A method for determining the state of charge of a battery, the method comprising:
   a) obtaining voltage readings from the battery when a light load is coupled to the battery;
   b) obtaining voltage readings from the battery when the light load is removed from the battery;
   c) obtaining voltage readings from the battery when a heavy load is coupled to the battery;
   d) obtaining voltage readings from the battery when the heavy load is removed from the battery;
   e) coupling a conductance tester to the battery to obtain cold cranking amp readings from the battery; and
   f) charging the battery and monitoring at least one battery parameter to determine whether the battery is capable of being charged.

2. The method of claim 1, wherein the battery parameter is selected from the group consisting of battery temperature and average battery current.

3. The method of claim 2, wherein failure of average battery current to exceed a predetermined amount in a predetermined amount of time indicates that the battery is substantially incapable of being charged, and terminates the charging.

4. The method of claim 2, wherein failure of battery temperature to exceed a predetermined amount in a predetermined amount of time indicates that the battery is too cold to charge, and terminates the charging.

5. The method of claim 1, further comprising determining battery state of charge using bounce back voltage.

6. The method of claim 1, further comprising determining a corrected battery voltage according to the following equation:

$$CBV=11.10-(1000-BR)/500-12*(80-PT)/1000-(1000-BR)/4000+ (7*(12.75-BB)/10)*(1+(1000-BR)/500)$$

where:
   CBV=Corrected Battery Voltage (DC volts);
   BR=Battery Rating (cold cranking amps);
   PT=Predicted Temperature of Battery (°F.); and
   BB=Bounce Back Voltage obtained after removal of a load (DC volts).

7. The method of claim 5, further comprising determining time to charge the battery as a function of the state of charge.

8. The method of claim 7, wherein the time to charge the battery is computed according to the following equation:

$$TTC=((KTEMP*SP*(100-SOC)/(30*CR))+5)$$

where:
   TTC=Time to Charge (minutes);
   KTEMP=constant associated with battery predicted temperature;
   SP=Set Point constant;
   SOC=State of Charge of battery (% of 100%); and
   CR=maximum continuous Charge Rate of charger (Amps).

9. The method of claim 1, further comprising monitoring battery cold cranking amps during charging to determine when the battery is substantially fully charged, thereby prompting termination of the charge.

10. The method of claim 9, wherein failure of cold cranking amp rate of change to exceed a predetermined amount over a predetermined period of time indicates that the battery is fully charged.

11. The method of claim 1, further comprising applying to a surface of the battery at least one bar code indicative of at least one battery characteristic.

12. The method of claim 11, further comprising reading a bar code with a light pen.

13. The method of claim 11, wherein a battery characteristic is an acid-to-paste ratio for the battery.

14. The method of claim 1, wherein the light and heavy loads comprise resistive loads drawing approximately 3 and 150 amperes from the battery, respectively.

15. An apparatus for testing the state of charge of a battery, comprising:
   a) a battery charger coupled to the battery;
   b) a light load coupled to the battery;
   c) a heavy load coupled to the battery;
   d) a conductance tester coupled to the battery; and e) a computer adapted to monitor battery parameters during battery testing by connecting the charger, the light load, the heavy load, and the conductance tester in a predetermined order with the battery, and to control battery charging in response to receipt of the parameters.

16. The apparatus of claim 15, wherein the light load is a resistive load drawing current from the battery of approximately 3 amperes.

17. The apparatus of claim 15, wherein the heavy load is a resistive load drawing current from the battery of approximately 150 amperes.

18. The apparatus of claim 15, wherein the battery includes on a surface thereof at least one bar code indicative of at least one battery characteristic.

19. The apparatus of claim 18, further comprising a light pen coupled to the computer for reading into the computer data corresponding to a bar code.

20. The apparatus of claim 18, wherein a battery characteristic is an acid-to-paste ratio for the battery.

21. An apparatus for charging and testing a battery comprising:
   a) a battery charger coupled to the battery;
   b) a resistive load coupled to the battery;
   c) a conductance tester coupled to the battery; and
   d) a controller testing whether a battery current reading obtained during the charging exceeds a predetermined level in a predetermined time.

22. The apparatus of claim 21 wherein the controller tests whether a rate of change of cold cranking amps during the charging exceeds a predetermined level in a predetermined time to end the charging.

* * * * *